US006538513B2

(12) United States Patent
Godfrey et al.

(10) Patent No.: US 6,538,513 B2
(45) Date of Patent: Mar. 25, 2003

(54) COMMON MODE OUTPUT CURRENT CONTROL CIRCUIT AND METHOD

(75) Inventors: Paul J. Godfrey, Melbourne, FL (US); Brian E. Williams, Malabar, FL (US); John S. Prentice, Palm Bay, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 10/005,096

(22) Filed: Dec. 3, 2001

(65) Prior Publication Data

US 2002/0079968 A1 Jun. 27, 2002

Related U.S. Application Data

(60) Provisional application No. 60/258,174, filed on Dec. 22, 2000.

(51) Int. Cl.[7] .................................................. H03F 3/45
(52) U.S. Cl. ........................ 330/258; 330/259; 330/253; 327/359
(58) Field of Search ................................. 330/253, 257, 330/258, 259, 261, 252; 327/359

(56) References Cited

U.S. PATENT DOCUMENTS 5,212,455 A * 5/1993 Pernici et al. ............... 330/253
5,844,442 A * 12/1998 Brehmer ...................... 330/258
6,388,522 B1 * 5/2002 Fattaruso et al. ........... 330/258

OTHER PUBLICATIONS

PCT Notification of Transmittal of the International Search Report of the Declaration, dated Aug. 27, 2002, 7 pages.
Haspeslagh J., et al., "Design Techniques for Fully Differential Amplifiers" *Proceedings of the Custom Integrated Circuits Conference*, New York, May 16, 1988, New York, IEEE, US, vol. CONF. 10, May 16, 1988, pp. 1221–1224 p. 12.2.2, right–hand column, line 25–p. 12.2.3, left–hand column; figure 3 (XP000042969).
Wambacq P. et al, "Efficient Symbolic Computation of Approximated Small–Signal Characteristics of Analog Integrated Circuits," *IEEE Journal of Solid–State Circuits*, IEEE Inc. New York, US, vol. 30, No. 3, Mar. 1, 1995, pp. 327–330, ISSN: 0018–9200, p. 329, right–hand column, figure 3 (XP0000502820).

* cited by examiner

*Primary Examiner*—Robert Pascal
*Assistant Examiner*—Henry Choe
(74) *Attorney, Agent, or Firm*—Gary R. Stanford

(57) ABSTRACT

An amplifier with common mode output control including a reference circuit, a current mirror input circuit, a differential current mirror, a summing junction, first and second feedback amplifiers, first and second feedback current mirrors, and a differential output circuit. The input circuit receives the differential input voltage and develops a differential input current having polarity currents that have a constant sum based on a reference signal. The differential current mirror mirrors the differential input current into first and second high impedance nodes. The feedback amplifiers and the feedback current mirrors generate feedback current into the high impedance nodes in response to variations of summing junction voltage and maintain a constant common mode current. The output circuit develops a differential output current based on the differential input current mirrored into the high impedance nodes. RC compensation is provided to compensate open loop gain and the common mode output current loop.

17 Claims, 1 Drawing Sheet

COMMON MODE OUTPUT CURRENT CONTROL CIRCUIT AND METHOD

CROSS-REFERENCE TO RELATED APPLICATION(S)

The present application is based on U.S. Provisional Patent Application entitled "Common Mode Output Current Control Circuit and Method", Ser. No. 60/258,174, filed Dec. 22, 2000, which is hereby incorporated by reference in its entirety.

FIELD OF THE INVENTION

The present invention relates to amplifiers and filters, and more particularly to a transconductance amplifier with a common mode output current control circuit for controlling the common mode level of the output signal.

DESCRIPTION OF RELATED ART

A differential input (In+, In−) to differential output (Out+, Out−) amplifying device typically implements a transfer function described by (Out+−Out−)=A(In+−In−) where "A" is the gain (or attenuation) of the amplifying device. The difference between the two outputs is determined by the amplifier, but the average value of the outputs, (Out++Out−)/2, otherwise referred to as the common mode output, is not necessarily determined or controlled by many such differential amplifying devices.

It is desired to control the common mode output for a differential amplifying device. There are other characteristics that are desired for an amplifying device. For example, it is often desired to provide a certain level of immunity to noise and fluctuations on the power supply line. It is also desired to provide as much linearity as possible of the transfer function between the input and output signals. Of course, many other characteristics and qualities are desired as known to those having skill in the relevant art.

SUMMARY OF THE PRESENT INVENTION

A differential transconductance amplifier with common mode output control according to an embodiment of the present invention includes a reference circuit that provides a reference signal, a current mirror input circuit, a differential current mirror, a summing junction, first and second feedback amplifiers, first and second feedback current mirrors, and a differential output circuit. The current mirror input circuit develops a differential input current in response to a differential input voltage, where the polarities of the differential input current have a constant sum. The constant sum of the polarities of the differential input current is based on the reference signal, such as being proportional thereto. The differential current mirror mirrors the differential input current into first and second high impedance nodes. The feedback amplifiers develop a differential feedback current through the summing junction which has a common mode current based on the reference signal. The first and second feedback current mirrors generate feedback current into the high impedance nodes from the summing junction in response to variations of summing junction voltage to maintain the common mode current. The differential output circuit develops a differential output current related to the voltage of the high impedance nodes and/or the differential input current mirrored into the high impedance nodes. Resistor/capacitor (RC) compensation circuits may be coupled to the high impedance nodes to compensate open loop gain and to compensate the common mode output current loop.

The differential transconductance amplifier exhibits many beneficial characteristics, including control of the common mode output signal, excellent immunity to noise and fluctuations on the power supply line, a control loop with wide bandwidth, a control loop that shares the same compensation method as the differential amplifier to save die area (e.g., when implemented on an integrated circuit (IC) or the like), a highly linear differential input voltage to differential output current transfer function when used as a feedback amplifier, easy adjustment of the desired common mode output current, and operation that is independent of the source voltages.

Each portion of the overall circuit may be implemented in any one of several suitable manners using suitable and complementary circuit components. The present invention is illustrated using metal oxide semiconductor (MOS) transistors include PMOS and NMOS transistors. The present invention, however, is not limited to the particular circuit or devices illustrated. For example, similar operation may be achieved using bipolar type devices, such as NPN and PNP bipolar junction transistors. A similar transconductance amplifier may also built with N-type transistors replacing the P-type transistors and P-type transistors replacing the N-type transistors, with the power supply or source signals (e.g. Vcc and Ground) exchanged. Many other specific circuit variations are possible and contemplated.

In a particular configuration, the reference circuit includes a bias resistor coupled to the source of a PMOS transistor having its gate and drain coupled together. A current reference, such as a current sink or the like coupled to the drain of the PMOS transistor, causes a corresponding reference voltage to develop at the gate of the PMOS transistor. The current mirror input circuit may include a pair of PMOS transistors having sources coupled to a source voltage via corresponding bias resistors. The PMOS transistors have gates coupled to the reference signal and drains coupled together at a common junction. Another pair of PMOS transistors each have a source coupled to the common junction, a gate receiving a polarity of the differential input voltage, and a drain that develops a respective one of first and second polarity signals of the differential input current. In this manner, the current mirror input circuit develops the differential input current based on the differential input voltage and the reference signal. In particular, the different polarities vary according to the differential input voltage but have a total current that is proportional to the reference signal. In one embodiment, the total current of the differential input voltage is equal to twice the level of a reference current.

The differential current mirror may include a first current mirror coupled to receive and mirror a first polarity the differential input current into the first high impedance node, and a second current mirror coupled to receive and mirror a second polarity the differential input current into the second high impedance node. In this manner, the differential input current is mirrored into the high impedance nodes used to develop the output current. In one embodiment, the first current mirror comprising first and second NMOS transistors having their gates coupled together and their sources coupled to the common source signal. The drain of the first NMOS transistor is coupled to the drain of the third PMOS transistor and where the drain of the second NMOS transistor is coupled to the first high impedance node. The second current mirror is configured in similar fashion using a pair of NMOS transistors for mirroring current into the second high impedance node.

The feedback amplifiers may also be implemented with NMOS transistors, each having a gate coupled to a respective one of the first and second high impedance nodes, a drain coupled to the summing junction and a source coupled to the common source signal via a bias resistor. The feedback current mirrors may each include a PMOS transistor having a gate receiving the reference signal, a source coupled to the summing junction, and a drain coupled to a respective one of the first and second high impedance nodes. The differential transconductance amplifier receives power from first and second power supply sources, such as VCC and GND signals. The summing junction may be coupled to a power supply voltage through one or more resistors. The PMOS transistors of the current mirror input circuit and the differential current mirror may all be matched PMOS transistors having their gates coupled to receive a reference voltage developed by the reference circuit.

An amplifying device with common mode output control according to an embodiment of the present invention includes an input circuit, a differential current mirror, a differential feedback current mirror amplifier, and a differential output circuit. The input circuit is responsive to a differential input signal and develops a differential input current having a common mode based on a reference signal. The differential current mirror mirrors the differential input current into a differential feedback node. The differential feedback current mirror amplifier develops a differential feedback current into the differential feedback node responsive to the differential input current and based on the reference signal to maintain a constant common mode current. The differential output circuit develops a differential output current based on voltage developed at the differential feedback node.

The differential feedback current mirror amplifier may include a summing junction, first and second feedback amplifiers and first and second feedback current mirrors. The first and second feedback amplifiers are coupled to the summing junction and to the differential feedback node and develops the differential feedback current through the summing junction to have a common mode current based on the reference signal. The first and second feedback current mirrors receive the reference signal and are coupled to the summing junction and to the high impedance nodes and generate feedback current into the differential feedback node from the summing junction in response to variations of summing junction voltage. The amplifying circuit may include a differential RC compensation circuit coupled to the differential feedback node.

A method of controlling the common mode output current of a differential amplifier includes generating a reference voltage, controlling a voltage generated differential input current so that a sum of first and second polarities of the input current is constant and based on the reference voltage, applying the first and second polarities of the input signal into first and second high impedance feedback nodes, generating first and second output currents through a summing junction based on corresponding voltages of the first and second feedback nodes, and generating first and second feedback currents through the summing junction and into the first and second feedback nodes, respectively, based on voltages of the summing junction and the reference voltage.

The method may further include generating first and second polarities of a differential output current signals based on corresponding voltages of the first and second feedback nodes. The method may also include compensating the differential amplifier with first and second RC filters at the first and second feedback nodes, respectively.

An integrated circuit for radio frequency (RF) communications may include a differential voltage source asserting a differential voltage, a mixer cell having a differential current input, and a low pass filter feedback amplifier. The low pass filter feedback amplifier is implemented in a similar manner as the differential transconductance amplifier or the amplifying device with common mode output control as previously described.

BRIEF DESCRIPTION OF THE DRAWINGS

A better understanding of the present invention can be obtained when the following detailed description of embodiments of the invention is considered in conjunction with the following drawing, in which.

DETAILED DESCRIPTION OF EMBODIMENTS OF THE INVENTION

Figure 1:
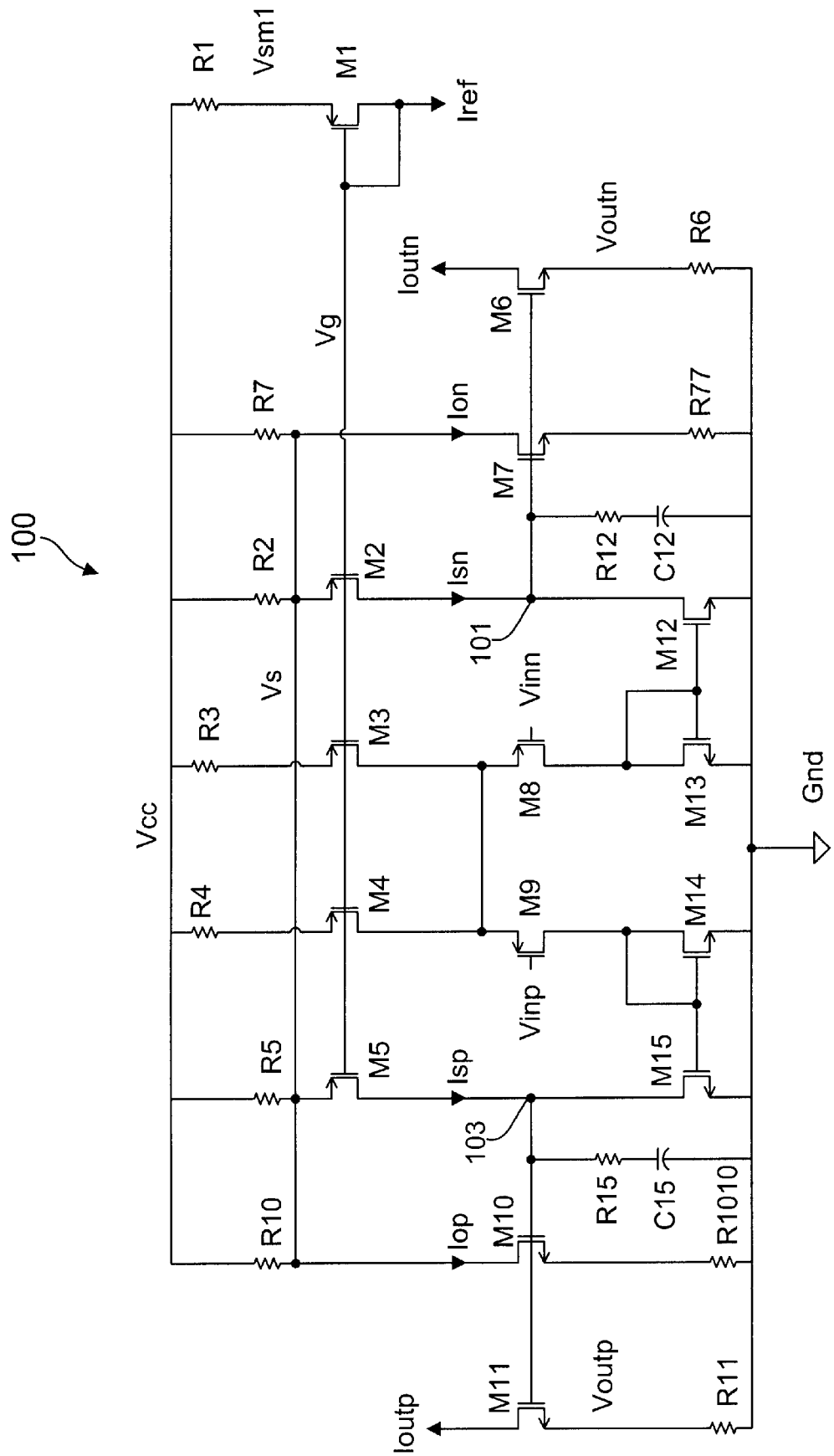
FIG. 1 is a schematic diagram of an exemplary transconductance amplifier with a common mode output current control circuit for controlling the common mode level of the output signal.

FIG. 1 is a schematic diagram of an exemplary transconductance amplifier 100 with common mode output current control for controlling the common mode level of the differential output signal. As will be appreciated from the following discussion, the transconductance amplifier 100 exhibits many beneficial characteristics, including control of the common mode output signal, excellent immunity to noise and fluctuations on the power supply line, a control loop with wide bandwidth, a control loop that shares the same compensation method as the differential amplifier to save die area (e.g., when implemented on an integrated circuit (IC) or the like), a highly linear differential input voltage to differential output current transfer function when used as a feedback amplifier, easy adjustment of the desired common mode output current, and operation that is independent of the source voltages.

The transconductance amplifier 100 includes resistors R1–R7, R10–R12, R15, R77 and R1010, capacitors C12 and C15, P-channel metal oxide semiconductor (PMOS) transistors M1–M5, M8 and M9, and N-channel MOS (NMOS) transistors M6, M7 and M10–M15. The resistors R1–R5, R7 and R10 have one end each coupled to a voltage supply signal Vcc. The other end of the resistor R1 develops a voltage signal Vsm1 and is coupled to the source of the transistor M1. The gate of the transistor M1 is coupled to its drain and develops a reference voltage signal Vg. A reference current Iref flows out of the drain of the transistor M1.

The gates of the transistors M1–M5 are coupled together at the Vg signal. The other end of each of the resistors R2 and R5 is coupled to a signal Vs and to the source of a respective one of the transistors M2 and M5. The other end of each of the resistors R7 and R10 is coupled to the Vs signal and to the drain of a respective one of the transistors M7 and M1. A current Ion flows into the drain of the transistor M7 and a current Iop flows into the drain of the transistor M10. The other end of each of the resistors R3 and R4 is coupled to the source of a respective one of the transistors M3 and M4. The drains of the transistors M2 and M5 are coupled to the drains of the transistors M12 and M15, respectively. A current Isn flows out of the drain of the transistor M2 and a current Isp flows out of the transistor M5.

The drain of the transistor M2 is also coupled to the gates of the transistors M6 and M7 and to one end of the resistor R12 at a first high impedance or feedback node 101. The other end of the resistor R12 is coupled to one end of the capacitor C12, having its other end coupled to ground. The drain of the transistor M5 is also coupled to the gates of the transistors M10 and M11 and to one end of the resistor R15 at a second high impedance or feedback node 103. The other end of the resistor R15 is coupled to one end of the capacitor C15, having its other end coupled to ground. The drains of the transistors M3 and M4 are coupled together and to the respective sources of the transistors M8 and M9. The gates of the transistors M8 and M9 receive respective polarities Vinn, Vinp of an input differential voltage signal Vin. The drain of the transistor M8 is coupled to the drain of the transistor M13 and to the gates of the transistors M12 and M13. The drain of the transistor M9 is coupled to the drain of the transistor M14 and to the gates of the transistors M14 and M15. The sources of the transistors M12–M15 are coupled to ground.

The source of the transistor M6 develops one polarity Voutn of an output voltage signal Vout and is coupled to one end of the resistor R6, having its other end coupled to ground. The source of the transistor M7 is coupled to one end of the resistor R77, having its other end coupled to ground. The source of the transistor M11 develops the other polarity Voutp of the output voltage signal Vout and is coupled to one end of the resistor R11, having its other end coupled to ground. The source of the transistor M10 is coupled to one end of the resistor R1010, having its other end coupled to ground. One polarity Ioutn of a differential output current Iout flows from the drain of the transistor M6. The other polarity Ioutp of the current Iout flows from the drain of the transistor M11.

The current Iref flows through the transistor M1 and is a reference current that determines the desired common mode output current of the output currents Ioutn and Ioutp. The current Iref is defined according to the following equation 1:

$$Iref = (Vcc - Vsm1)/R1 \quad (EQ.\ 1)$$

where "/" denotes division. Thus, the voltage Vsm1 at the source of the transistor M1 is given by the following equation 2:

$$Vsm1 = Vcc - (R1)Iref \quad (EQ.\ 2)$$

The voltage of the Vg node at the gate of the transistor M1 is determined by the current (I) to voltage (V) characteristics of the type of transistor selected and sustains the current Iref through M1 with the previously determined voltage on the source of the transistor M1. The Vg signal is also applied to the gates of the transistors M2, M3, M4, and M5. In the embodiment shown, the transistors M1–M5 are configured to be essentially identical.

The transistors M13 and M12 are configured as a unity gain current mirror so that the current Isn is approximately the same as the source current of the transistor M8. In a similar manner, the transistors M14 and M15 are configured as unity gain current mirror so that the current Isp is approximately the same as the source current of the transistor M9. The transistors M3 and M4 are each configured as a current mirror with respect to the transistor M1 so that each provides a current that is equal to or otherwise proportional to Iref. In the embodiment shown, each transistor M3 and M4 provides a current of Iref, so that the sum of the current in the sources of the transistors M8 and M9 is approximately two times Iref or 2Iref. In this manner, the transistors M3, M4, M8 and M9 form a current mirror input circuit that develops a voltage generated differential input current (through M8 and M9), where the differential input current has a constant sum. Thus, regardless of the differential input voltage Vin applied to the gates of transistors M8 and M9, the sum of the Isn and Isp currents is provided by the following equation 3:

$$Isn + Isp\ 2Iref \quad (EQ.\ 3)$$

Thus, the current mirrors M14, M15 and M12, M13 form a differential current mirror that mirrors the differential input current.

The common mode output current of the transconductance amplifier 100, referred to as Iocm, is defined by the following equation 4:

$$Iocm = (Ioutp + Ioutn)/2 \quad (EQ.\ 4)$$

In the embodiment shown, the transistors M7 and M6 are equal in size and operate under substantially identical conditions so that Ion=Ioutn. The same is true for the transistors M10 and M11 so that Iop=Ioutp. Thus, Iocm is also provided according to the following equation 5:

$$Iocm = (Ion + Iop)/2 \quad (EQ.\ 5)$$

It is desired that Iocm be equal to Iref. An error current between Iref and Iocm is defined according to the following equation 6:

$$Ierr = Iref - Iocm \quad (EQ.\ 6)$$

where Ierr may be positive or negative. In this manner, combining equations 5 and 6 provides the relationship of the following equation 7:

$$Iop + Ion = 2Iref - 2Ierr \quad (EQ.\ 7)$$

The currents at node Vs are summed to obtain the following equation 8:

$$I_{R10} + I_{R5} + I_{R2} + I_{R7} = Ion + Isn + Isp + Iop \quad (EQ.\ 8)$$

If the resistances of R1, R2, R5, R7 and R10 are approximately equal, so that R10=R5=R2=R7=R1, then the effective parallel resistance of the resistors R2, R5, R7 and R10 between nodes Vs to Vcc, referred to as Rp, is (R1)/4. The collective current through these four resistors, referred to as $I_{Rp}$, is defined according to the following equation 9:

$$I_{Rp} = Ion + Isn + Isp + Iop \quad (EQ.\ 9)$$

Using relationships previously described, the following equation 10 is derived:

$$(Vcc - Vs)/Rp = 2Iref - 2Ierr + 2Iref \quad (EQ.\ 10)$$

Since Rp=(R1)/4 and using the above equations, the following equation 11 is derived for Vs:

$$Vs = Vsm1 + R1(Iref - Iocm)/2 \quad (EQ.\ 11)$$

It is noted that since Vcc has dropped out of the expression, the behavior of the Iocm correction loop is unaffected by the value of Vcc. This provides significant power supply immunity.

In the embodiment shown, the transistors M1, M2, and M5 share the same gate voltage and are substantially identical transistors. The transistors M2 and M5 each operated as a feedback current mirror that provides feedback current from the summing junction Vs into the high impedance or feedback nodes 101, 103, respectively, based on variations of the summing junction Vs. In particular, if Iref>Iocm, then Vs>Vsm1, so that the (Isn+Isp)>2$I_{M1}$, where $I_{M1}$, is the current through the transistor M1. It is noted, however, that $I_{M1}$=Iref, so that (Isn+Isp)>2Iref, which would otherwise violate equation 3 above. The positive excess current raises the voltage on the gates of the transistors M7 and M10 because of the high impedance in the drains of the transistors M12, M2, M15, and M5. The increase in the gate voltage of the transistors M7 and M10 increases the drain currents, Ion and Iop, of the transistors M7 and M10, until Iocm becomes equal to the reference current Iref. In a similar manner, if Iocm>Iref, then the gate voltages of the transistors M7 and M10 decrease thereby decreasing the drain currents, Ion and Iop. This decrease occurs until Iocm becomes equal to Iref Thus, the feedback loop of the transconductance amplifier 100 drives the gate voltages of the transistors M7 and M10 to maintain the relationship Iocm=Iref.

The differential output voltage Vout may be connected in a closed loop, negative feedback topology used for a wide variety of functions. Such configuration results in a differential output voltage Vout that is very linear with respect to the differential input voltage Vin. The polarity signals Voutp and Voutn of the differential output voltage are impressed across resistors R11 and R6, respectively. The resistors R77, R6, R1010, and R11 are equal in one embodiment shown, although differing values are also contemplated depending upon the particular configuration. The resistors R77, R6, R110, and R11 also have low voltage coefficients and, hence, the source currents of the transistors M6 and M11 are very linear with respect to the differential input voltage Vin. In this manner, the differential output currents Ioutn and Ioutp are very linear with respect to the differential input voltage Vin. The transconductance amplifier 100 is particularly useful as the feedback amplifier in a low pass filter, where the output current can be fed directly into a mixer cell for radio frequency (RF) communications applications.

The series connected resistor/capacitor (RC) combinations of the resistor R12 with the capacitor C12 and of the resistor R15 with the capacitor C15 each serve a dual purpose. First, the open loop gain of the transconductance amplifier 100 is compensated by these RC combinations. Second, since the gates of the transistors M7 and M10 are part of the common mode output current adjustment circuit, these RC combinations serve to compensate the common mode output current loop of the transconductance amplifier 100. The use of the same RC combination for dual purposes saves die area, making the circuit more efficient and less expensive. It is also noted that since the connection of M7 and M10 is made directly to the current summing node Vs, minimum extra capacitance is connected in the Iocm error correction loop. This results in a wide bandwidth for this loop.

It is noted that the present invention is not limited to the particular circuit illustrated. For example, operation is similar to that described above when bipolar PNP devices are used instead of the PMOS devices. Also, the transistors M2, M3, M4 and M5 need not be identical to the transistor M1. Further, NPN bipolar transistors or the like may be used instead of the NMOS devices. Instead of gate voltage adjustment of the transistors M7, M6, M10 and M11, base current adjustment occurs with bipolar transistors. The base current has negligible impact on the circuit performance. The current mirrors formed by the transistors M1 with M2, M3, M4 and M5, the current mirror formed by the transistors M13 with M12, and the current mirror formed by the transistors M14 with M15 may instead be of any conventional design. A similar transconductance amplifier may also built with N-type transistors replacing the P-type transistors and P-type transistors replacing the N-type transistors, with the Vcc and Gnd power supply signals exchanged.

Although a system and method according to the present invention has been described in connection with one or more embodiments, it is not intended to be limited to the specific form set forth herein, but on the contrary, it is intended to cover such alternatives, modifications, and equivalents, as can be reasonably included within the spirit and scope of the present invention.

What is claimed is:

1. A differential transconductance amplifier with common mode output control, comprising:

a reference circuit that provides a reference signal;

a current mirror input circuit, coupled to the reference circuit, that develops a differential input current in response to a differential input voltage, wherein polarities of the differential input current have a constant sum;

a differential current mirror, coupled to the current mirror input circuit, that mirrors the differential input current into first and second high impedance nodes;

a summing junction coupled to a first source signal via at least one resistive device, the first source signal referenced to a common source signal;

first and second feedback amplifiers, each coupled to the summing junction and to a respective one of the first and second high impedance nodes, that develops a differential feedback current through the summing junction, the differential feedback current having a common mode current based on the reference signal;

first and second feedback current mirrors, each coupled to the reference circuit and to the summing junction and to a respective one of the first and second high impedance nodes, that generates feedback current into the high impedance nodes from the summing junction in response to variations of summing junction voltage; and a differential output circuit, coupled to the high impedance nodes, that develops a differential output current.

2. The differential transconductance amplifier of claim 1, wherein the reference circuit comprises:

a bias resistor coupled to the first source signal; and a PMOS transistor having a source coupled to the bias resistor and a gate and drain coupled together.

3. The differential transconductance amplifier of claim 2, further comprising a current sink coupled to the drain of the PMOS transistor that draws a reference current so that a reference voltage develops at the gate of the PMOS transistor.

4. The differential transconductance amplifier of claim 1, wherein the current mirror input circuit comprises:

first and second bias resistors, each coupled to the first source signal;

first and second PMOS transistors having their drains coupled together at a common junction, each having a source coupled to a respective one of the first and second resistors and a gate receiving the reference signal; and third and fourth PMOS transistors, each having a gate receiving a polarity of the differential input voltage, a source coupled to the common junction, and a drain that develops a respective one of first and second polarity signals of the differential input current.

5. The differential transconductance amplifier of claim 4, wherein the differential current mirror comprises:

a first current mirror comprising first and second NMOS transistors having their gates coupled together and their sources coupled to the common source signal, wherein the drain of the first NMOS transistor is coupled to the drain of the third PMOS transistor, and wherein the drain of the second NMOS transistor is coupled to the first high impedance node; and a second current mirror comprising third and fourth NMOS transistors having their gates coupled together and their sources coupled to the common source signal, wherein the drain of the third NMOS transistor is coupled to its gate and to the drain of the fourth PMOS transistor, and wherein the drain of the fourth NMOS transistor is coupled to the second high impedance node.

6. The differential transconductance amplifier of claim 1, wherein the differential current mirror comprises:

a first current mirror coupled to receive and mirror a first polarity the differential input current into the first high impedance node; and a second current mirror coupled to receive and mirror a second polarity the differential input current into the second high impedance node.

7. The differential transconductance amplifier of claim 6, wherein:

the first current mirror comprises first and second NMOS transistors having their gates coupled together and their sources coupled together at the common source signal, wherein the drain of the first NMOS transistor is coupled to its gate to form a first junction for receiving the first polarity of the differential input current, and wherein the drain of the second NMOS transistor is coupled to the first high impedance node; and the second current mirror comprising third and fourth NMOS transistors having their gates coupled together and their sources coupled together at the common source signal, wherein the drain of the third NMOS transistor is coupled to its gate to form a first junction for receiving the second polarity of the differential input current, and wherein the drain of the fourth NMOS transistor is coupled to the second high impedance node.

8. The differential transconductance amplifier of claim 1, wherein the first and second feedback amplifiers each comprise an NMOS transistor having a gate coupled to a respective one of the first and second high impedance nodes, a drain coupled to the summing junction and a source coupled to the common source signal via a bias resistor.

9. The differential transconductance amplifier of claim 1, wherein the first and second feedback current mirrors each comprise a PMOS transistor having a gate receiving the reference signal, a source coupled to the summing junction, and a drain coupled to a respective one of the first and second high impedance nodes.

10. The differential transconductance amplifier of claim 1, further comprising:

a first resistor/capacitor (RC) compensation circuit coupled between the first high impedance node and the common source signal; and a second RC compensation circuit coupled between the first high impedance node and the common source signal.

11. An amplifying device with common mode output control, comprising:

an input circuit, responsive to a differential input signal, that develops a differential input current having a common mode based on a reference signal;

a differential current mirror, coupled to the input circuit, that mirrors the differential input current into a differential feedback node;

a differential feedback current mirror amplifier, coupled to the differential feedback node, that develops a differential feedback current into the differential feedback node responsive to the differential input current and based on the reference signal to maintain a constant common mode current; and a differential output circuit, coupled to the differential feedback node, that develops a differential output current based on voltage developed at the differential feedback node.

12. The amplifying circuit of claim 11, wherein the differential feedback current mirror amplifier comprises:

a summing junction;

first and second feedback amplifiers, each coupled to the summing junction and to a respective polarity of the differential feedback node, that develops the differential feedback current through the summing junction having a common mode current based on the reference signal; and first and second feedback current mirrors, each receiving the reference signal and coupled to the summing junction and to a respective one of the first and second high impedance nodes, that generates feedback current into the differential feedback node from the summing junction in response to variations of summing junction voltage.

13. The amplifying circuit of claim 11, further comprising a differential RC compensation circuit coupled to the differential feedback node.

14. A method of controlling the common mode output current of a differential amplifier, comprising:

generating a reference voltage;

controlling a voltage generated differential input current so that a sum of first and second polarities of the input current is constant and based on the reference voltage;

applying the first and second polarities of the input signal into first and second high impedance feedback nodes;

generating first and second output currents through a summing junction based on corresponding voltages of the first and second feedback nodes; and generating first and second feedback currents through the summing junction and into the first and second feedback nodes, respectively, based on voltages of the summing junction and the reference voltage.

15. The method of claim 14, further comprising:

generating first and second polarities of a differential output current signals based on corresponding voltages of the first and second feedback nodes.

16. The method of claim 14, further comprising:

compensating the differential amplifier with first and second RC filters at the first and second feedback nodes, respectively.

17. An integrated circuit for radio frequency communications, comprising:

a differential voltage source asserting a differential voltage;

a mixer cell having a differential current input; and a low pass filter feedback amplifier, comprising:

a reference circuit that provides a reference signal;

a current mirror input circuit, coupled to the reference circuit and the differential voltage source, that develops a differential input current in response to the differential voltage, wherein polarities of the differential input current have a constant sum;

a differential current mirror, coupled to the current mirror input circuit, that mirrors the differential input current into first and second high impedance nodes;

a summing junction;

first and second feedback amplifiers, each coupled to the summing junction and to a respective one of the first and second high impedance nodes, that develops a differential feedback current through the summing junction, the differential feedback current having a common mode current based on the reference signal;

first and second feedback current mirrors, each coupled to the reference circuit and to the summing junction and to a respective one of the first and second high impedance nodes, that generates feedback current into the high impedance nodes from the summing junction in response to variations of summing junction voltage; and a differential output circuit, coupled to the high impedance nodes, that provides a differential output current to the differential current input of the mixer cell.

* * * * *